(12) United States Patent
Chang

(10) Patent No.: US 6,607,674 B2
(45) Date of Patent: Aug. 19, 2003

(54) METHOD OF REPAIRING A PHASE SHIFTING MASK

(75) Inventor: Ching-Yu Chang, Yilan Hsien (TW)

(73) Assignee: Macronix International CO, Ltd., Hsinchu (TW)

(*) Notice: Subject to any disclaimer, the term of this patent is extended or adjusted under 35 U.S.C. 154(b) by 321 days.

(21) Appl. No.: 09/726,459

(22) Filed: Nov. 30, 2000

(65) Prior Publication Data

US 2002/0030034 A1 Mar. 14, 2002

(30) Foreign Application Priority Data

Sep. 13, 2000 (TW) .................................. 89118676 A

(51) Int. Cl.$^7$ ................................................ B81B 7/02
(52) U.S. Cl. ......................... 216/12; 216/24; 216/57; 216/79; 216/101; 216/109; 430/5; 430/8; 430/369
(58) Field of Search .................. 216/12, 24, 49, 216/51, 57, 79, 99, 101, 109; 430/5, 8, 396

(56) References Cited

U.S. PATENT DOCUMENTS

| | | | | |
|---|---|---|---|---|
| 5,376,483 A | * | 12/1994 | Rolfson | 430/5 |
| 5,695,896 A | * | 12/1997 | Pierrat | 430/5 |
| 5,741,613 A | * | 4/1998 | Moon et al. | 430/5 |
| 5,759,724 A | * | 6/1998 | Rolson | 430/5 |
| 6,162,565 A | * | 12/2000 | Chao et al. | 430/5 |
| 6,296,975 B1 | * | 10/2001 | Moon et al. | 430/5 |

* cited by examiner

Primary Examiner—Gregory Mills
Assistant Examiner—Allan Olsen
(74) Attorney, Agent, or Firm—J.C. Patents

(57) ABSTRACT

A phase shifting mask repair process is described. The process uses an etching gas or a hydrofluoric acid solution to etch the quartz substrate and the characteristics of the phase shifter layer being only slightly etched when clean with a $NH_3/H_2O_2/H_2O_2$ solution to calculate and adjust the respective processing time accordingly. As a result, the phase difference between the quartz substrate and the MoSiON phase shifter layer stays relatively the same before and after the repair process.

11 Claims, 4 Drawing Sheets

METHOD OF REPAIRING A PHASE SHIFTING MASK

CROSS-REFERENCE TO RELATED APPLICATION

This application claims the priority benefit of Taiwan application serial no. 89118676, filed Sep. 13, 2000.

BACKGROUND OF THE INVENTION

1. Field of the Invention

The present invention relates to a method of repairing and cleaning a half-tone phase shifting mask (HTPSM). More particularly, the present invention relates to a method, wherein an etching is employed and the etching is applicable for etching a quartz substrate according to the thickness consumption of the MoSiON phase shifter layer, which then allows the phase difference of a mask to remain relatively unchanged after washing or repeated repairing.

2. Description of the Related Art

In the current photolithography procedure, a phase shifting mask can be used to raise the resolution of pattern transfer during a photolithographic procedure. Usually, an ultraviolet light is used as the light source when the stepper is implementing an exposure process. Consequently, the ultimate resolution provided by the exposure system hinges on the wavelength of the light source that is being used. The important parameters that defines the exposure system's pattern-transfer ability include the parameter of the lowest resolution provided by the exposure system and the depth of focus (DOF) of exposure system. The lower is the lowest resolution, the higher is the DOF, and the better the exposure effect. However, the wavelength of the light source has an opposite effect on these two parameters. In another words, when the wavelength of the light source is short, even if the exposure system can provide a relatively low resolution, the DOF is reduced at the same time. Thus, when designing an exposure system, one must consider the pros and the cons of resolution and the tradeoffs in the DOF.

In the conventional phase shifting photolithography a few phase shifter layers added to the original traditional mask are used. Through the positive and negative interference derived from these phase shifter layers during an exposure, the image pattern projected on the chip has a better resolution. A special feature of the conventional phase shifting lithography is that it does not require the use of a new light source. Merely performing the repairs on the mask, the resolution ability of the exposure system is increased to its original status. However, in the existing technique for a mask manufacturing, multiple repairs cannot be done. Since every repair causes the thickness of the phase shifter layer to thin out and the phase difference between mask substrate to change, the mask cannot be used after the repair.

FIGS. 1A to 1E are schematic diagrams in cross-sectional view illustrating a PSM manufacturing method in the prior art.

Referring to FIG. 1A, a construction of a mask substrate 100 is provided, wherein the substrate can be made of a material such as quartz with relatively good translucency. Next, on the substrate 100 are sequentially formed a phase shifter layer 102, an opaque shield layer 104 and a photoresist layer 106. The phase shifter layer 102 is made of a material such as MoSiON, the opaque shield layer 104 is made of a thin film of chrome or a chrome oxide.

Subsequently, referring to FIG. 1B, the photolithographic procedure is used to define the photoresist layer 106, and dry etching is used to etch the opaque shield layer 104, thereby exposing the phase shifter layer 102.

Referring to FIG. 1C, the phase shifter layer 102 is etched, thereby exposing a portion of the substrate 100.

Furthermore, referring to FIG. 1D, the photoresist layer 106 is removed and another photoresist 108 layer is coated, and using the photoresist layer 108 as a mask, another portion of the opaque shield layer 104 is removed.

Finally, referring to FIG. 1E, the photoresist layer 108 of 1D is removed. The above-described removal of the photoresist layers 106 and 108 is usually performed by using a sulfuric acid/hydrogen peroxide ($H_2SO_4/H_2O_2$) solution. However, this procedure usually would result with a part of the photoresist layer and defective particles remaining, influencing the quality of the PSM. When there is too much defective particle residue or if the opaque shield is defective, repairs and cleaning must be performed on the mask. Consequently, the prior art still uses a SC1 ($NH_3/H_2O_2/H_2O$ solution to perform deep cleaning in order to remove the excess defective particles on the PSM.

In the PSM reworked cleaning process of the prior art in which the SC1 solution is used for the cleaning, the SC1 solution also etches the phase shifter and reduces the thickness of the phase shifter, causing the phase difference between the substrate and the phase shifter to change. If the phase difference is too large, then the mask cannot be used. If SC1 solution is not used, then removing the defective particles becomes a difficult task.

SUMMARY OF THE INVENTION

In view of the above, the present invention provides a method to enable the PSM to be cleaned or to have repeated repairs without generating the disadvantageous phase difference as in the prior art.

As embodied and broadly described herein, the invention provides a PSM manufacturing method, at least including providing a substrate and forming sequentially a phase shifter layer and an opaque shield layer on the substrate. The phase shifter layer and the opaque shield layer are then defined. An etching is further conducted on the substrate to a predetermined depth, exposing a portion of the substrate. A cleaning procedure is performed, wherein the cleaning procedure etches a portion of the phase shifter surface, and the predetermined depth is decided based on how much of the phase shifter is etched during the cleaning procedure.

According to a preferred embodiment of the invention, the substrate material is quartz, the phase shifter material is MoSiON and the opaque shield material is chrome or chrome oxide. Compensated by the etching procedure, the phase difference between the substrate and the phase shifter layer after the definition of the opaque shield layer and the phase shifter layer is the same as the phase difference between the substrate and the phase shifter layer after the cleaning process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Although the preferred embodiment of the present invention is described with respect to a manufacturing method for a half-tone PSM, the invention is applicable also to a manufacturing method for an alternative PSM or a RIM PSM.

Figure 1A:
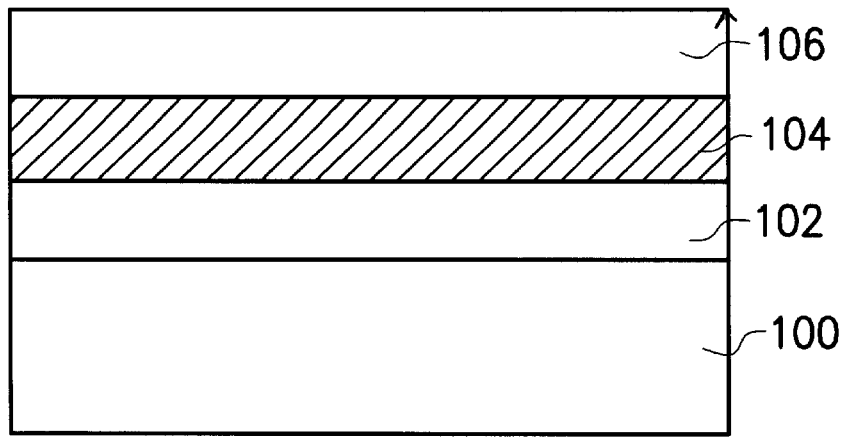
FIGS. 1A to 1E are schematic diagrams in cross-sectional view illustrating a phase shifting mask (PSM) manufacturing method in the prior art.
Figure 1B:
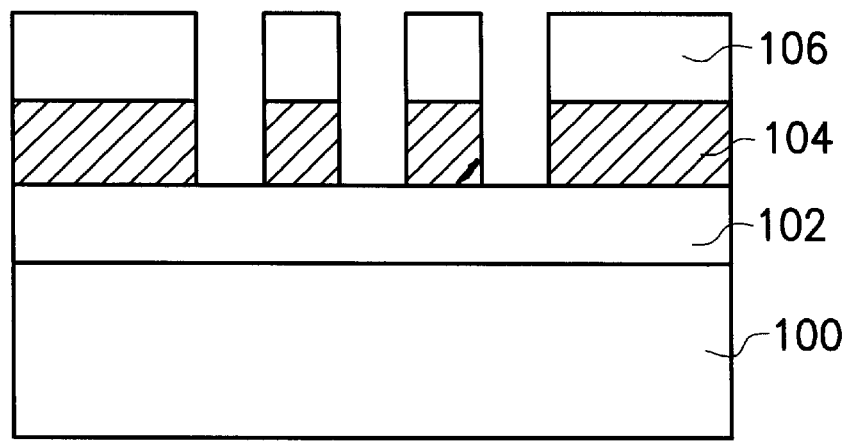
Figure 1C:
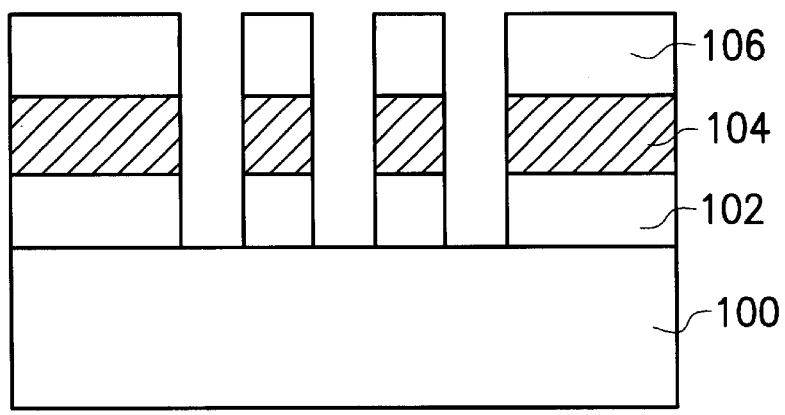
Figure 1D:
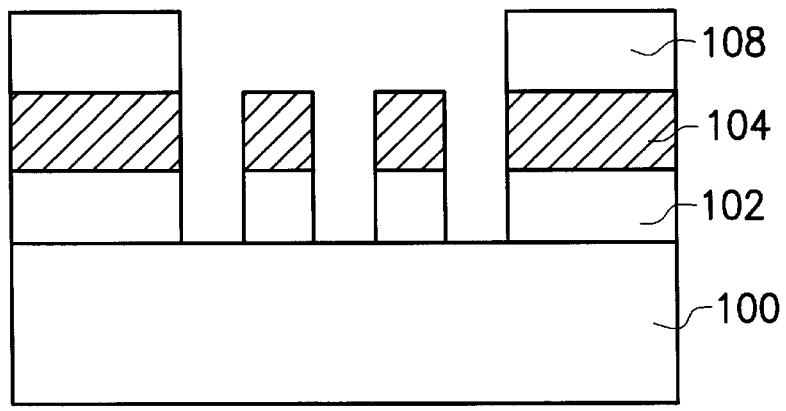
Figure 1E:
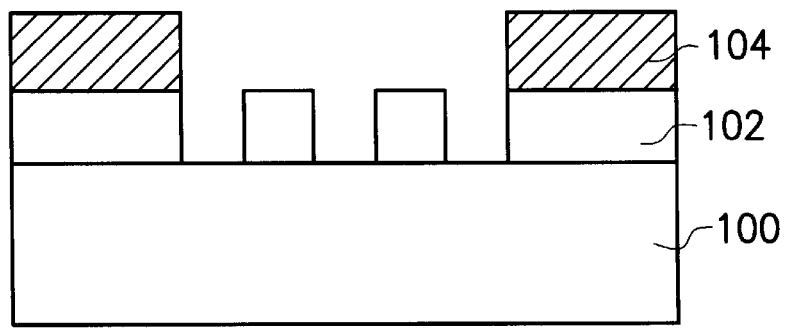
Figure 2A:
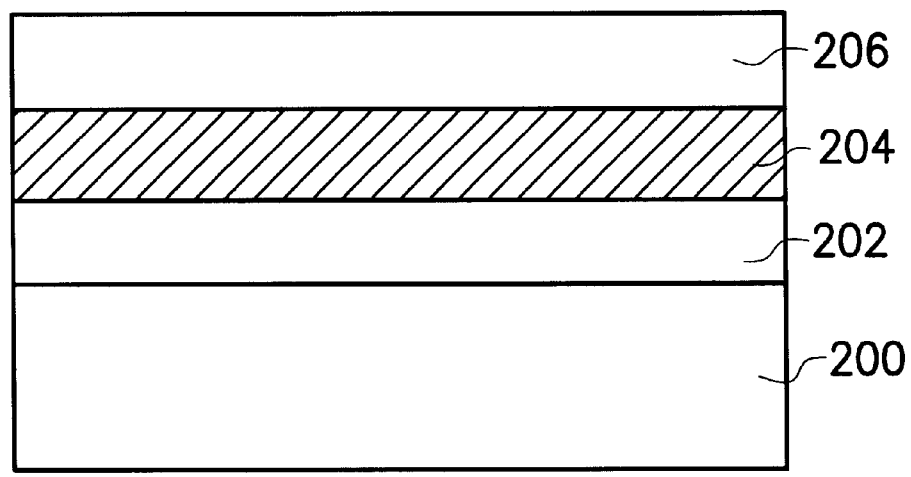
FIGS. 2A to 2E are schematic diagrams in cross-sectional view illustrating a manufacturing method for a phase shift mask according one preferred embodiment of the present invention.

FIGS. 2A to 2E are schematic diagrams in cross-sectional view illustrating a PSM manufacturing method, according to one preferred embodiment of this invention. Referring to FIG. 2A, a substrate 200 is provided, wherein a material for the substrate 200 is preferably highly translucent quartz. A phase shifter layer 202, an opaque shield layer 204 and a photoresist layer 206 are successively formed on the quartz substrate 200. The material of the phase shifter 202 is chrome, chrome oxide, or a film in a combination of the two.

Figure 2B:
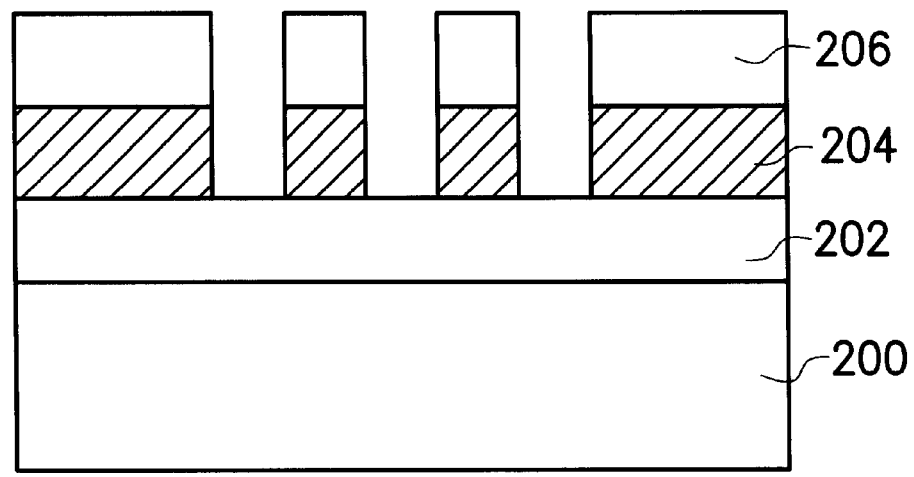

Referring to FIG. 2B, the photolithographic procedure is used to define the photoresist layer 206, thereby patterning the photoresist layer 206. Using the patterned photoresist layer 206 as an etching mask to dry etch the opaque shield layer 204, thereby exposing the phase shifter layer 202.

Subsequently, referring to FIG. 2C, the phase shifter layer 202 is further etched, thereby exposing a portion of the substrate 200.

Figure 2C:
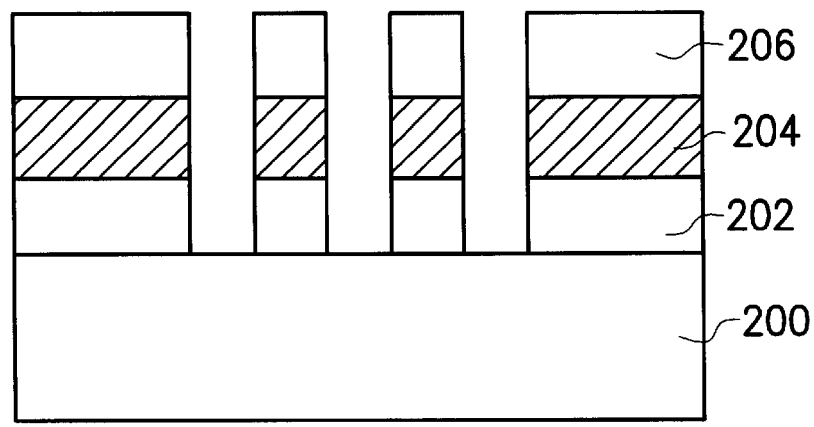
Figure 2D:
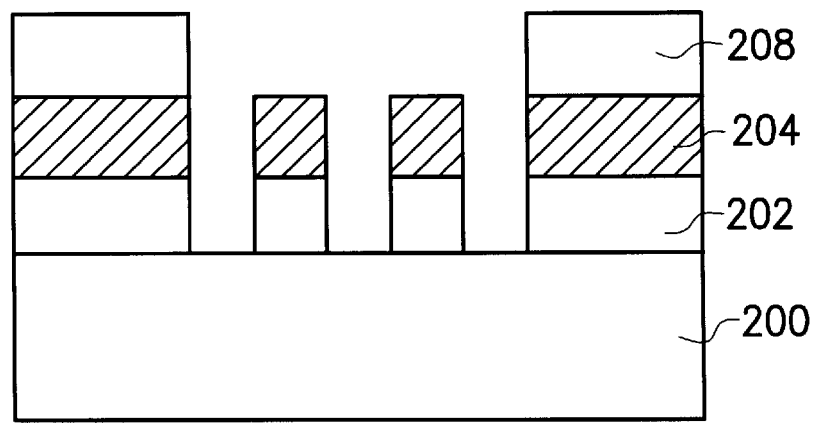

Referring to FIG. 2D, the patterned photoresist layer 206 in FIG. 2C is removed. Another patterned photoresist layer 208 is formed. Using the patterned photoresist layer 208 as a mask, another portion of the opaque shield layer 204 is etched.

Figure 2E:
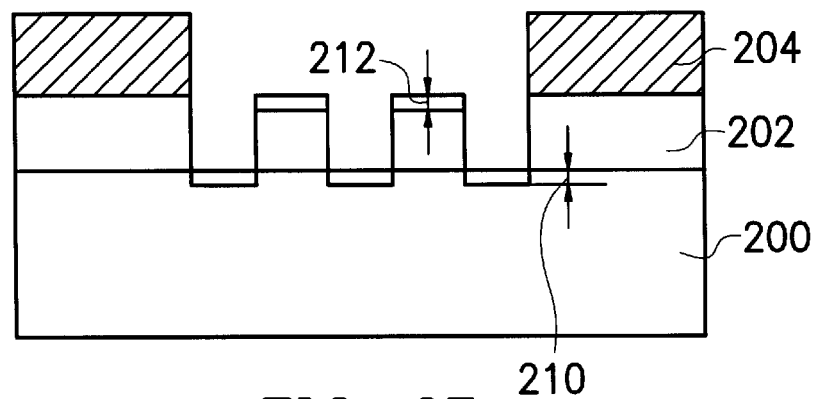

Referring to FIG. 2E, the patterned photoresist layer 208 in 2D is removed. The above-described removal of the patterned photoresist layers 206 and 208 was performed using a $H_2SO_4/H_2O_2$ solution. An evaluation is then performed on the photoresist layer. If there are too many contaminated particles, a SCI ($NH_3/H_2O_2/H_2O$) solution is used to perform another cleaning. In order to prevent the subsequent cleanings from causing deviation of the phase difference, an etching procedure is performed, etching the substrate 200 to a predetermined depth 210. The etching procedure may include dry etching or wet etching using hydrofluoric (HF) acid or a ($NH_4F/HF$) solution, for example, and can adjust the etching depth by controlling the etching time. A cleaning procedure is further performed, using ($NH_3/H_2O_2/H_2O$) to clean the mask surface, removing the contaminated particle residue. However, the SC1 solution etches a portion of the phase shifter layer 202, the reduced thickness is as indicated by the reference number 212, and the amount of the reduced thickness 212 is related to the length of cleaning time.

It is well known in the art that the phase difference resulted from the light rays in a medium is related to the thickness of the medium. Due to the cleaning procedure, the thickness of the phase shifter layer is reduced, and an eventual shifting of the phase difference. However, based on the cleaning time, the reduced thickness can be estimated. The present invention, can based the extent of the shifting to calculate the appropriate corresponding reduced thickness of the substrate in the substrate etching procedure and the corresponding etching time to compensate the shifting of the phase difference of the phase shifter layer. As a result, the phase difference formed between the substrate and the phase shifter layer after the definition of the opaque shield layer and the phase shifter layer remains the same as the phase difference formed between the post-cleaned substrate and the phase shifter layer.

The technique disclosed in the present invention is applicable not only for phase difference compensation in a PSM cleaning procedure, but is also applicable for repairing a PSM. For example, when a defect emerges in the phase shifter layer or on the substrate surface during manufacturing the process of the present invention can be used to appropriately etch the substrate, and to reduce the thickness of the shifter using the SC1 solution. Hence, the defect is removed and the phase difference can remain unchanged.

Based on the foregoing, one of the important characteristics of the present invention is to use an etching procedure to suitably reduce the thickness of the substrate. Furthermore, the extent of the thickness reduction of the substrate is adjusted according to the consumption of the thickness of the shifter layer to maintain the consistency of the original phase difference when light rays pass through the quartz substrate and the phase shifter layer. The method can be applied to photoresist cleaning and repair, thereby raising the manufacturing productivity of the PSM.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a phase shifting mask (PSM), comprising:
   providing a substrate, thereupon forming sequentially a phase shifter layer and an opaque shield layer;
   defining the phase shifter layer and the opaque shield layer, respectively;
   performing an etching procedure, etching the substrate and exposing a portion of the substrate, and etching the substrate to a predetermined depth; and
   performing a cleaning procedure, wherein the cleaning procedure etches a portion of the phase shifter surface, and the predetermined depth is based on an etched thickness of the phase shifter layer in the cleaning procedure.

2. The method according to claim 1, wherein the substrate is a quartz substrate.

3. The method according to claim 1, wherein the shifter layer is MoSiON.

4. The method according to claim 1, wherein the opaque shield is selected from the group consisting of a chrome film, chrome oxide film and a combination of the chrome film and the chrome oxide film.

5. The method according to claim 1, wherein after defining the opaque shield layer and the phase shifter layer, a phase difference formed between the substrate and the phase shifter layer is a same as a phase difference formed between the substrate and the phase shifter layer after the cleaning procedure.

6. The method according to claim 1, wherein defining the opaque shield layer and the phase shifter layer includes
   forming a first patterned photoresist layer on a surface of the opaque shield layer;

etching the opaque shield layer and the shifter layer using the first patterned photoresist as a mask;

removing the first patterned photoresist layer;

forming a second patterned photoresist on the surface of the opaque shield layer;

etching the opaque shield layer; and removing the second patterned photoresist layer.

7. The method according to claim 6, wherein the removal process of the first patterned photoresist layer and the second patterned photoresist layer use a sulfuric acid/hydrogen peroxide ($H_2SO_4/H_2O_2$) solution to perform a cleaning procedure at a temperature of about 125° C.

8. The method according to claim 1, wherein the cleaning procedure is performed using a $NH_3/H_2O_2/H_2O_2$ solution.

9. The method according to claim 1, wherein the etching procedure includes using hydrofluoric acid to etch the substrate.

10. The method according to claim 1, wherein the etching procedure includes dry etching.

11. The method according to claim 1, wherein the etching procedure includes using a $NF_4F/HF$ solution to etch the substrate.

* * * * *